United States Patent [19]

Jolly

[11] Patent Number: 4,592,307

[45] Date of Patent: Jun. 3, 1986

[54] VAPOR PHASE DEPOSITION APPARATUS

[75] Inventor: Stuart T. Jolly, Yardley, Pa.

[73] Assignee: RCA Corporation, Princeton, N.J.

[21] Appl. No.: 706,968

[22] Filed: Feb. 28, 1985

[51] Int. Cl.$^4$ .............................................. C23C 16/00
[52] U.S. Cl. .................... 118/719; 118/725;
 118/726; 118/728; 118/729; 118/733
[58] Field of Search ............... 118/728, 729, 719, 725,
 118/726, 733, 715; 156/610, 611, 613, 614

[56] References Cited

U.S. PATENT DOCUMENTS

| | | | |
|---|---|---|---|
| 3,391,017 | 7/1968 | Bolger et al. | 156/614 |
| 3,441,000 | 4/1969 | Burd et al. | 118/719 |
| 3,446,659 | 5/1969 | Wisman et al. | 427/93 |
| 3,492,969 | 2/1970 | Emeis | 118/715 |
| 3,617,371 | 11/1971 | Burmeister, Jr. | 156/611 |
| 3,645,695 | 2/1972 | Koepp et al. | 118/715 X |
| 3,838,722 | 8/1974 | Reuter et al. | 118/48 |
| 3,925,119 | 12/1975 | Philbrick et al. | 156/610 X |
| 4,316,430 | 2/1982 | Jolly et al. | 118/725 |

OTHER PUBLICATIONS

J. V. DiLorenzo et al., "Effects of the AsCl$_3$ Mole Fraction on the Incorporation of Germanium, Silicon, Selenium, and Sulfur into Vapor Grown Epitaxial Layers of GaAs" J. Electrochem. Soc.: Solid State Science, vol. 118, No. 11, Nov. 1971, pp. 1823-1830.

J. V. DiLorenzo, "Vapor Growth of Epitaxial GaAs: A Summary of Parameters Which Influence the Purity and Morphology of Epitaxial Layers" Journal of Crystal Growth 17 (1972), pp. 189-206.

Primary Examiner—John D. Smith
Attorney, Agent, or Firm—Birgit E. Morris; William J. Burke; Henry Steckler

[57] ABSTRACT

A conventional vapor phase deposition reactor tube typically formed of quartz is provided with a tubular liner supporting one or two crucibles carrying in turn one or two boats for holding constituents used for the deposition process. The liner, crucibles and boats are formed preferably of pyrolytic boron nitride (PBN). Reactant or constituent gas carrying tubes are formed preferably of sapphire. A buffer zone of an inert gas upstream of the liner and between the liner and the tube serves to isolate the liner and reactor tube from contaminating gases.

7 Claims, 4 Drawing Figures

VAPOR PHASE DEPOSITION APPARATUS

The present invention relates to apparatus for depositing material from the vapor phase onto a substrate. More particularly, the invention relates to a vapor phase deposition apparatus in which an epitaxial film can be grown on a crystalline semiconductor substrate substantially free of contaminants usually present in conventional reactor apparatus.

BACKGROUND OF THE INVENTION

A conventional configuration for a deposition reactor is an open-ended, substantially tubular-shaped chamber, a portion of which is mounted within a furnace or heating means. In the deposition process, a substrate is placed in a heated portion of the reactor and appropriate reactant gases are introduced such that they pass over the substrate. For example, to deposit an epitaxial layer of GaAs on a GaAs substrate, the reactant gases contain GaCl and AsH$_3$ and the substrate is heated to about 700° C. Additionally, controlled amounts of impurities may be introduced during the deposition, for example, so as to form N or P doping in the epitaxial film. As more and more III–V compounds are used for high performance devices made by epitaxial vapor deposition, the adverse sensitivity to contaminants present in the conventional reactor tube is critically important.

The contaminants are derived from materials such as quartz of which the reactor chambers are made. Quartz contains residues of water which decompose into oxygen and hydrogen, the oxygen doping the deposited layer unfavorably. Moreover, iron, for example, and other contaminants in trace quantities, may be present in the quartz which can react with the chlorides to form metallic chloride vapors which mix with the deposition material adversely. Moreover, silicon from the quartz can function as a contaminant when it is in a non-silicon containing layer. For a more detailed description of the contaminating effects of materials such as quartz, see the following articles: "Effects Of The AsCl$_3$ Mole Fraction On The Incorporation of Germanium, Silicon, Selenium, And Sulfur Into Vapor Grown Epitaxial Layers of GaAs, "by J. V. DiLorenzo and G. E. Moore, Jr., J. Electrochem. Soc.: Solid State Science, Vol. 118, No. 11, November 1971 and "Vapor Growth Of Epitaxial GaAs: A Summary Of Parameters Which Influence The Purity And Morphology Of Epitaxial Layers, " by J. V. DiLorenzo, Journal of Crystal Growth 17 (1972).

It is clear there is a need in the art for a reactor that provides a deposition environment that is substantially free, if not totally free, of contaminants that evolve from conventional reactor apparatus.

SUMMARY OF THE INVENTION

A vapor phase deposition apparatus is provided with a reactor tube within which is positioned a tubular liner. Means are provided for positioning a substrate within said liner. Reactant gases are passed through the liner to deposit a layer of material on the substrate. A gas seal is provided for isolating the liner from the reactor tube by a non-reactive flushing gas passing between the liner and the reactor tube.

In a preferred form of the apparatus, the liner is formed of a non-contaminating material, such as pyrolytic boron nitride (PBN), while the gas is passed in tubes formed of a non-contaminating material such as sapphire. The apparatus provides an epitaxial layer that is free of trace contaminants from the quartz reactor tube such as oxygen, silicon and iron, etc., as well as contaminants introduced by diffusion out of or through seals in the apparatus.

DETAILED DESCRIPTION OF A PREFERRED EMBODIMENT OF THE INVENTION

Figure 1:
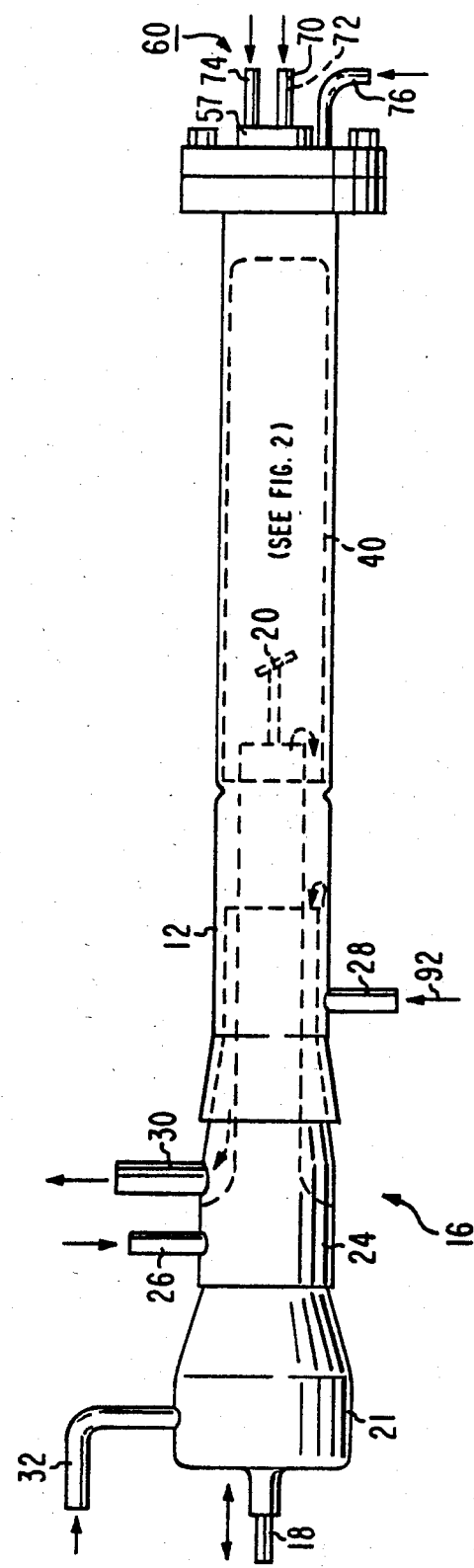
FIG. 1 is an elevation view of a deposition apparatus embodying the present invention.

A vapor phase deposition apparatus 10 embodying the present invention consists of a conventional reactor tube 12 positioned within a furnace 14 which heats the interior of the tube 12. An example of the use of the invention is for epitaxial deposition of III–V compounds such as GaInAsP.

A wafer input and purging gas means 16 is provided at the downstream portion of the reactor 12. A suitable structure for such means is disclosed in U.S. Pat. No. 4,316,430 issued on Feb. 23, 1982 to S. T. Jolly, et al. and which is incorporated herein by reference. The means 16 includes a rod 18 for moving a substrate 20 into position within the reactor 12. The rod 18 is carried within a bearing and plug assembly 24 in the form of a tapered tube. Inlet ports 26 and 28 provide means for carrying non-reactive purging gases, such as hydrogen, into the downstream portions of the chamber of the reactor tube 12. An exit port 30 is provided to carry or exit all gases of the apparatus 10, including spent reacting gases and purging gases. An inlet port 32 in the plug assembly 21 provides an inlet for a non-interfering gas, such as hydrogen, to provide a gas seal for the rod 18.

The furnace 14 is arranged to provide a preheating zone 14a, a deposition zone 14b and a reaction zone 14c. The furnace 14, according to the present embodiment, is formed of heating coils or resistance elements surrounding the reactor tube 12 and energized with conventional apparatus. The invention, however, is not limited to such heating means. With suitable modifications of the apparatus 10, RF energy, or radiant heating means, such as radiant lamps, may also be used.

In the conventional arrangement of apparatus providing for vapor phase epitaxial deposition of III–V compounds, a plurality of tubes typically provide gases, such as phosphine (PH$_3$) or arsine (AsH$_3$), to react with metal-containing vapors, such as gallium chloride (GaCl) or indium chloride (InCl). The apparatus is operated to provide for a reaction of those gases so that either gallium arsenide (GaAs) or indium phosphide (InP) is deposited as an epitaxial layer on a substrate of either of those compounds. More complex layers can be formed. As indicated above, such a conventional reactor is a source of contaminants from the wall of the reactor 12, typically formed of quartz. The contaminants may be in the form of silicon, oxygen or iron, etc., as indicated above.

According to the present invention, a wall of contamination material, such as the quartz wall of the tube 12, is isolated from the reactant gases and the substrate 20 by a tubular liner 40. Liner 40 is nearly coaxially positioned within the tube 12 and slightly spaced therefrom, as indicated by the space 42. Liner 40 has a closed end 40a oriented to face upstream and is provided with three apertures 44, 46 and one not shown. The liner 40 is further provided with an open end as indicated at 40b facing downstream. Several dimples 48 are provided on the inner wall of the reactor tube 12 to limit the longitudinal movement of the liner 40.

Figure 2:
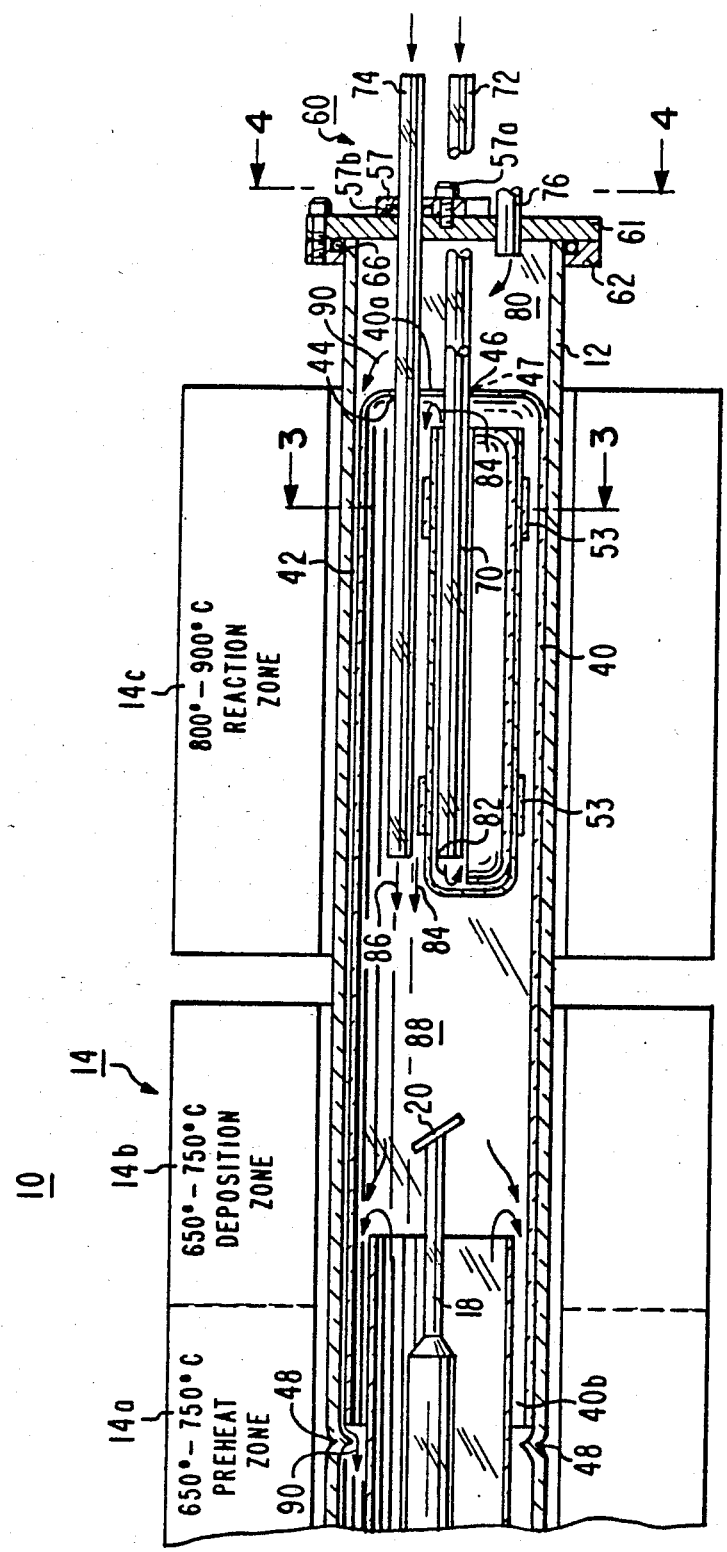
FIG. 2 is an enlarged sectional portion of the apparatus of FIG. 4 as seen along viewing line 2—2 showing in detail the tubular liner portion of the apparatus and the related components thereof according to the present invention.
Figure 3:
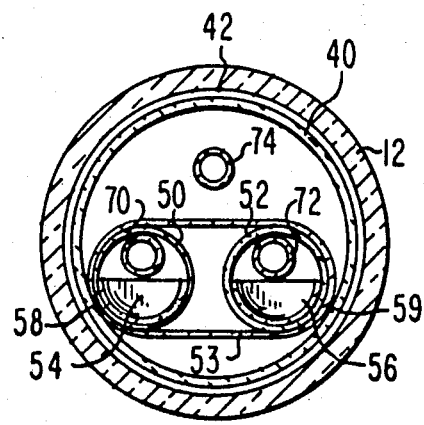
FIG. 3 is a sectional view as seen along viewing line 3—3 of FIG. 2.
Figure 4:
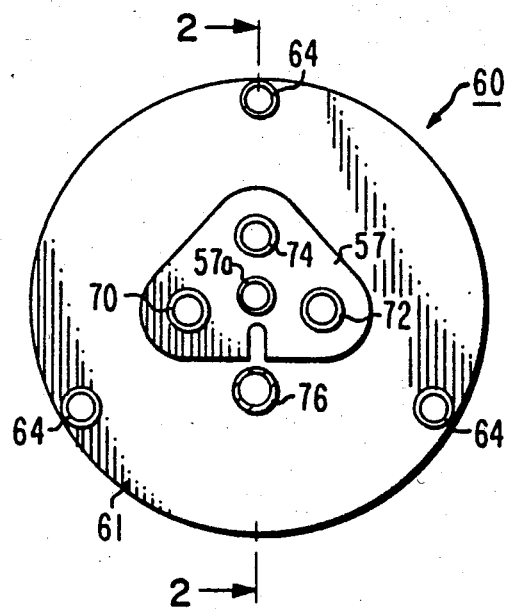
FIG. 4 is an end view of the upstream (right) end of FIG. 1.

A first crucible 50 and a second crucible 52 are positioned within the liner 40 and clamped together with support rings 53, as shown in FIGS. 2 and 3. The crucibles 50 and 52 are positioned to contact the inner wall of the liner 40 for support as at wall locations 58 and 59, as shown in FIG. 3. A first boat 54 and a second boat 56 are each respectively positioned within the crucibles 50 and 52.

Each of the components of the apparatus 10 comprising the liner 40, crucibles 50 and 52, support ring 53 and boats 54 and 56 are formed of an non-reactive material, that is, a material that does not emit or is otherwise a source of any contaminants to the deposition process. As explained above, the reactor tube 12 will emit, in response to acid and high temperatures, contaminants of silicon, oxygen, and iron, etc., all of which may have a deleterious effect on the epitaxial layer being deposited on the substrate 20. Thus, contamination to the deposition process, as may be derived from the conventional reactor tube, is caused by two independent effects. First, the reactor tube may react with a constituent material introduced to the apparatus during the process to emit a contaminant. A quartz tube, is one example, by which silicon, the basic material of the quartz tube, at times is undesiredly emitted into the reactor chamber in the environment of an active gas or high furnace temperature. Second, a trace-contaminating material, such as iron or other trace elements, within the tube material itself will either be emitted in elemental form or react with a constituent gas to be passed into the reaction process.

A material that has been found to be very satisfactory as being free of such contaminants or reactions is pyrolytic boron nitride (PBN) made by the Union Carbide Company. Since PBN is a rather fragile material, it is very difficult, but not impossible, to form into liners, crucibles and boats. Other material, not yet known, may serve as a better material to make these reactor components. Tubes of substantial length are very difficult to make using PBN material. For that reason, the tubes used herein are made of sapphire.

An end seal 60, formed of stainless steel, provides a closure for the upstream end of the reactor tube 12. The end seal 60 consists of a stainless steel plate 61 with an annular recess or ledge to receive the tube 12 formed by a stainless steel clamping ring 62 attached by three screws 64. An O-ring 66, made of resilient and impervious material, such as Teflon (DuPont) or neoprene rubber seals the tube 12. A preferred O-ring 66 is typically made of Viton (DuPont), formed of a fluorocarbon rubber. O-ring 66 is clamped in sealing relationship to minimize leakage of gases to the ambient from the interior of the reactor 12.

Three tubes (70, 72 and 74) formed of sapphire are inserted through the end seal 60 to the interior of the reactor 12. A seal plate 57 is attached to seal 60 by a screw 57a. Each of tubes 70, 72 and 74 pass through a respective aperture of the plate 57 and are sealed with an O-ring 57b. Tubes 70, 72 and 74 are inserted into the liner 40, respectively, through the liner apertures 44, 46 and 47 (not seen). Tubes 70 and 72 are extended into the crucibles 50 and 52 through the respective apertures 46 and 47. The tubes 70 and 72 are tapered, particularly at the longitudinal portion passing into the liner end 40a, and suitably spring-biased to provide a downstream force of about 0.5 pound to effect a snug fit to reduce, if not eliminate, leakage of gas from the liner 40. Tube 74 is similarly tapered at the portion passing through liner aperture 44 and extended into the chamber of the liner 40 (above) external to the crucibles 50 and 52.

A fourth tube 76, formed of stainless steel and integrally joined with the end seal 60, as by a weld, is used to carry a flushing gas, such as hydrogen, into the region 80 of the reactor between the end seal 60 and the end wall 40a of the liner 40. Region 80 functions as a gas wall to isolate gas leakages or diffusion that may occur into or from the interior of the liner 40, as will be explained hereinafter. The tube 76 is thus relatively short and merely extends into the chamber region 80, as shown in FIG. 2.

In operation, a metal, such as gallium as a first example, is placed in boat 54 and a gas, such as $AsH_3$, is conducted into the chamber via tube 74. A reactant gas, such as hydrogen choride (HCl) in a dilutent vehicle of hydrogen gas ($H_2$) is passed over the crucible 50 via tube 70. The reacted gas and the dilutant gas containing gallium chloride and hydrogen will follow the path of the arrow 82 over the metal in the boat 54 and exit from the upstream open end of crucible 50 as shown by arrow 84. The gas passing through tube 74, namely arsine, will follow the path shown by arrow 86. The two gases mix and react in a known manner in the region 88 causing a deposit of gallium arsenide (GaAs) on the substrate 20.

In another example providing a more complex epitaxial layer combining gallium, indium, arsenic and phosphorus, a pair of boats 54 and 56 are used for gallium and indium, respectively. Hydrogen chloride diluted with hydrogen is passed through tubes 70 and 72, respectively, to react with the metals in the boats 54 and 56. A mixture of arsine, phosphine and a dilutant gas, such as hydrogen, are combined in tube 74 and passed into the mixing region 88. The resultant gas mixture, including the chlorides of the metal from the boats 54 and 56 of gallium and indium, are deposited in a layer epitaxially on the substrate 20 as the compound indium, gallium, arsenide, phosphide (InGaAsP).

In operation, the apparatus 10 performs in a conventional manner in the sense that the temperatures of preheating, deposition, reaction and the flow rates of the respective gases are operated within conventional ranges. However, according to the invention, the flushing of the chamber region 80 upstream of the liner 40 provides for an excellent gas seal that isolates the metallic seal 60 from the reaction portion of the apparatus 10. Flushing gas, such as hydrogen, is provided at a suitable rate, for example, of 200 milliliters per minute to flush the region 80 and to isolate the system from leakage and diffusion gases to and from the ambient. Flow path 90 shows how the flushing gas is exhausted passed the liner 40 towards the exhaust exit 30.

Moreover, a purging gas is provided at inlet port 28 to pass along path 92 within the substrate positioning portion of means 16 and then to the exhaust outlet 30. In this way, an effective gas shield is provided to also seal the various components of the substrate positioning portion of means 16 and the reactor tube 12. Purging gases are also provided as inlet ports 26 and 32 to maintain a seal of the members from the ambient. If desired, small amounts of phosphine and arsine can be added to the purging gas of hydrogen at inlet port 26 to provide a preconditioning of the substrate 20 as it is being moved to the deposition zone 14b.

Various modifications of the apparatus 10 may be made within the principles of the invention. Thus, only a single reactant gas tube, such as tube 70 or 72, carrying only one reactant gas such as a mixture of hydrogen and arsenic trichloride may be needed for an arrangement using but a single boat (54 or 56) carrying a constituent material such as GaAs. Also, two tubes carrying reactant gases, such as two tubes 74 positioned side-by-side, may be provided for certain processes requiring two separate gases. However, in any arrangement, it is essential that a flushing or purging gas be provided in the region 80 between the seal 60 and the liner 40 to provide an isolation gas seal. Indeed, the structure of liner 40, etc., described above may be formed of quartz rather than PBN and still benefit from the usefulness derived from the baffle region 80.

While the invention has been described for use with the 111-V compounds, the invention may be used for epitaxial deposition of other materials such as silicon alone or mercury, cadmium, telluride (HgCdTe) compounds.

I claim:

1. A vapor phase deposition apparatus comprising: a reactor tube formed of quartz;
   a tubular liner formed of pyrolytic boron nitride (PBN) positioned within said reactor tube;
   means for positioning a substrate within said liner;
   means comprising one or more gas tubes each formed of sapphire for carrying reactant gases through an aperture for each gas tube in a wall of said liner to deposit a layer of material on said substrate;
   each of said gas tubes being arranged to be in snug-fit but gas-leak relation through its associated aperture in said wall of said liner establishing thereby a leakage flow path of gas around said gas tube through said aperture; and
   means for isolating said liner from said reactor tube by a non-reactive flushing gas passing said flushing gas around said gas tube at said aperture to prevent reactant gases from leaking into or from the interior of said liner through said leakage gas flow path.

2. A vapor phase deposition apparatus formed of an elongated tube having an upstream and downstream open end, a reaction zone spaced from the upstream end, and a deposition zone adjacent said reaction zone, first sealing means for sealing the downstream end and further including exit port means for exiting all the spent gases of said apparatus, and means for movably inserting and holding a substrate from said downstream end through said tube to said deposition zone, wherein the improvement comprises:
   (a) a tubular liner positioned within the reaction zone of said elongated tube and slightly spaced from said elongated tube and further having an open end facing downstream to receive said substrate and a closed end facing upstream having at least one aperture adapted to receive a first gas tube for carrying a reactant gas into said apparatus;
   (b) a tubular crucible positioned within said liner and along the reaction zone and having a closed end oriented to face downstream toward said downstream end of said elongated tube;
   (c) a boat positioned within said crucible for holding one of the constituents to be deposited;
   (d) said first gas tube passing through said liner aperture and extending substantially the full length over said boat to pass a first reactant gas against the closed end of said crucible and be reflected back over said one constituent in said boat to react with said first gas to provide thereby a gas of said one constituent;
   (e) said first gas tube being tapered for a close fit to pass through and in gas sealing relationship with said liner aperture;
   (f) a second sealing means for sealing the upstream end, and having an aperture for said first tube; and
   (g) a second gas tube passing through a second aperture of said second sealing means for carrying an non-reactive flushing gas into said apparatus to isolate said second sealing means from said liner and to pass around said tubular liner and exit through said exit port means.

3. An apparatus according to claim 2 wherein said elongated tube is formed of a reactant material containing emitting and reacting contaminants to said deposition process and said liner, crucible, boat and gas tubes is formed of a material that does not emit contaminants and is non-reactive to the gases of the deposition processes.

4. The apparatus of claim 3 further including a third gas tube extending through said liner and adjacent said crucible to provide a constituent gas in the vicinity of said substrate.

5. The apparatus of claim 3 wherein said second tube is spaced upstream from said tubular liner end to provide a buffer region between said liner and said upstream sealing means to receive said non-reactive flushing gas.

6. The apparatus of claim 3 wherein said elongated tube is formed of quartz and said tubular liner, crucible and boat are each respectively formed of pyrolytic boron nitride (PBN), and said gas carrying tube within said reaction zone is formed of sapphire.

7. The apparatus of claim 4 wherein said third gas tube is formed of sapphire.

* * * * *

UNITED STATES PATENT AND TRADEMARK OFFICE
CERTIFICATE OF CORRECTION

PATENT NO. : 4,592,307

DATED : June 3, 1986

INVENTOR(S) : Stuart Talbot Jolly

It is certified that error appears in the above-identified patent and that said Letters Patent is hereby corrected as shown below:

Column 1, line 44, closing quotation marks should be after "GaAs,".

Column 1, line 44, opening quotation marks should be deleted before "by".

Column 4, line 26, "choride" should be --chloride--.

Column 5, line 45, after "passing" insert --between said liner and said reactor tube including passing--.

Signed and Sealed this

Fourteenth Day of October, 1986

[SEAL]

Attest:

DONALD J. QUIGG

Attesting Officer

Commissioner of Patents and Trademarks